United States Patent [19]
Murayama

[11] Patent Number: 5,828,253
[45] Date of Patent: Oct. 27, 1998

[54] PHASE SYNCHRONIZATION SYSTEM WHICH REDUCES POWER CONSUMPTION AND HIGH FREQUENCY NOISE

[75] Inventor: Tohru Murayama, Tokyo, Japan

[73] Assignee: NEC Corporation, Tokyo, Japan

[21] Appl. No.: 823,682

[22] Filed: Mar. 25, 1997

[30] Foreign Application Priority Data

Mar. 28, 1996 [JP] Japan ................................ 8-073696

[51] Int. Cl.⁶ .................................................. H03L 7/10
[52] U.S. Cl. ......................... 327/156; 331/1 A; 331/25; 331/DIG. 2; 327/159
[58] Field of Search ................................ 327/156, 159; 331/1 A, 25, DIG. 2

[56] References Cited

U.S. PATENT DOCUMENTS

| 5,170,135 | 12/1992 | Ito et al. | 331/1 A |
| 5,294,894 | 3/1994 | Gebara | 331/1 A |
| 5,304,954 | 4/1994 | Saito et al. | 331/1 A |
| 5,347,232 | 9/1994 | Nishimichi | 331/1 A |
| 5,363,419 | 11/1994 | Ho | 375/120 |

FOREIGN PATENT DOCUMENTS 06187063  7/1994  Japan .

*Primary Examiner*—Timothy P. Callahan
*Assistant Examiner*—An T. Luu
*Attorney, Agent, or Firm*—Whitham, Curtis & Whitham

[57] ABSTRACT

The invention provides a phase synchronization system which stops, when an input of a phase reference signal from the outside stops, oscillation of a voltage-controlled oscillator to achieve reduction in power consumption and can produce and output a system clock signal free from high frequency pulse noise from the voltage controlled oscillator. The system includes a phase comparator, a phase synchronization circuit including a low-pass filter and a voltage-controlled oscillation circuit, a clock detection circuit for detecting the clock signal from the outside, a phase coincidence discrimination circuit for discriminating a phase coincidence condition at the phase synchronization circuit, an AND gate, and a stop/start control circuit including a pair of flip-flop circuits. When the clock signal from the outside stops, oscillation of the voltage-controlled oscillation circuit is stopped with control information from the stop/start control circuit. When the input of the clock signal is resumed, a phase synchronization signal from the voltage-controlled oscillation circuit is outputted to the outside via the AND gate after phase coincidence is discriminated by the phase coincidence discrimination circuit.

13 Claims, 3 Drawing Sheets

PHASE SYNCHRONIZATION SYSTEM WHICH REDUCES POWER CONSUMPTION AND HIGH FREQUENCY NOISE

BACKGROUND OF THE INVENTION

1. Field of the Invention

A phase synchronization system which produces and outputs a phase synchronization signal synchronized with a phase reference signal inputted thereto.

2. Description of the Related Art

A phase synchronization circuit typically has such a construction as shown in FIG. 3. Referring to FIG. 3, the phase synchronization circuit shown receives a clock signal as a phase reference signal inputted thereto from the outside and produces and outputs a clock signal synchronized in phase with the clock signal as a phase reference signal. To this end, the phase synchronization circuit generally denoted at 4 includes a phase comparator 1, a low-pass filter (hereinafter referred to simply as LPF) 2, and a voltage-controlled oscillation circuit (hereinafter referred to simply as VCO) 3. A clock signal 101 from the outside is inputted to the phase comparator 1, by which it is compared in phase with a clock signal 105 outputted from the VCO 3. The phase comparator 1 outputs information of a phase "lead" when the phase of the clock signal 105 leads the phase of the clock signal 101, but outputs information of a phase "lag" when the phase of the clock signal 105 lags the phase of the clock signal 101, as phase comparison information 102 to the LPF 2. The LPF 2 removes high frequency components from the phase comparison information 102 and outputs a resulting signal as phase error information 103 to the VCO 3. The VCO 3 has an oscillation frequency which is controlled with the voltage level of the phase error information 103 outputted from the LPF 2, and consequently, the phase of the clock signal 105 outputted from the VCO 3 is controlled with the phase error information 103. The clock signal 105 is fed back to the phase comparator 1 as described above so that phase comparison between the clock signal 101 and the clock signal 105 is performed by the phase comparator 1 as described above. By negatively feeding back the phase information of the clock signal 105 to be outputted to the outside to form a phase synchronization system in this manner, the clock signal 105 is produced and outputted as a clock signal which is synchronized in phase with the clock signal 101 inputted from the outside.

In the phase synchronization circuit described above, normally if the frequency characteristic of the VCO 3 is set to a wide range, the phase synchronization circuit is liable to be influenced by noise. Therefore, the lower limit to the oscillation frequency of the VCO 3 is restricted. Consequently, even if, in order to stop oscillation of the VCO 3, the input of the clock signal 101 inputted from the outside is stopped so that the oscillation of the VCO 3 may be stopped while a power supply voltage remains applied to the phase synchronization circuit 4, the oscillation of the VCO 3 continues with the lower limit frequency and cannot be stopped.

Accordingly, the phase synchronization circuit described above is disadvantageous in that, where it is applied to a phase synchronization system which is formed from a circuit which consumes power only by switching of a signal such as a CMOS circuit, power consumption of the circuit cannot be stopped fully only by the measure to stop the input of the clock signal 101.

On the other hand, upon transition from a condition wherein the input of the clock signal 101 remains stopped to another condition wherein the VCO 3 oscillates again, the clock signal 105 is outputted from the phase synchronization circuit 4 before the condition of the phase synchronization circuit 4 in oscillation frequency and phase becomes stable. Consequently, the clock signal 105 in this instance is superposed with a high frequency pulse signal of noise. Consequently, the phase synchronization circuit is disadvantageous also in that a circuit to which such a clock signal 105 as just described is supplied is likely to malfunction.

SUMMARY OF THE INVENTION

It is an object of the present invention to provide a phase synchronization system wherein, when an input of a phase reference signal from the outside stops, oscillation of a voltage controlled oscillator stops while a power supply voltage remains supplied to achieve reduction in power consumption.

It is another object of the present invention to provide a phase synchronization system which produces and outputs a synchronization signal from which high frequency pulse noise signals generated by a voltage controlled oscillator are removed thereby to eliminate an otherwise possible malfunction of a circuit to which the synchronization signal is supplied.

In order to attain the objects described above, according to the present invention, there is provided a phase synchronization system, comprising a phase synchronization section including a phase comparator, a low-pass filter and a voltage-controlled oscillation circuit, the phase comparator comparing a phase of a phase reference signal inputted thereto from the outside with a phase of a phase synchronization signal fed back from the voltage-controlled oscillation circuit, the low-pass filter removing high frequency components of phase comparison information outputted from the phase comparator, an oscillation frequency of the voltage-controlled oscillation circuit being controlled with a phase difference signal outputted from the low-pass filter so that the voltage-controlled oscillation circuit oscillates and outputs the phase synchronization signal, an input signal detection section for detecting whether or not the phase reference signal is inputted to the phase synchronization section and outputting input signal detection information of a first level, a phase coincidence discrimination section for receiving, when an input of the phase reference signal is detected by the input signal detection section, the phase comparison information outputted from the phase comparator of the phase synchronization section, discriminating whether or not a phase error at the phase synchronization section satisfies an allowable phase coincidence requirement and outputting phase coincidence information of a second level when it is discriminated that the phase error satisfies the allowable phase coincidence requirement, and a voltage-controlled oscillation circuit stop/stop control section for receiving, when the input of the phase reference signal to the phase synchronization section stops, an input of the input signal detection information of the first level outputted from the input signal detection section and outputting oscillation control signal for stopping the oscillation of the voltage-controlled oscillation circuit of the phase synchronization section and for receiving, when the phase reference signal is inputted to the phase synchronization section, the phase synchronization signal outputted from the phase synchronization section and outputting the received phase synchronization signal as a modified phase synchronization signal, which does not include a pulse noise signal produced by the oscillation of the voltage-controlled oscillation circuit, in response to the input signal detection information of the first level outputted from the input signal detection section and the phase coincidence information of the second level outputted from the phase coincidence discrimination section.

The voltage-controlled oscillation circuit stop/start control section may include a first flip-flop circuit for receiving an input of the phase synchronization signal outputted from the voltage-controlled oscillation circuit and an input of the input signal detection information of the first level outputted from the input signal detection section, generating stop/start control information for controlling the stop/start of the oscillation of the voltage-controlled oscillation circuit and outputting the stop/start control information to the voltage-controlled oscillation circuit, a second flip-flop circuit for receiving the phase synchronization signal outputted from the voltage-controlled oscillation circuit and the phase coincidence information of the second level outputted from the phase coincidence discrimination section and producing and outputting phase synchronization output control information, and an AND gate for logically ANDing the stop/start control information outputted from the first flip-flop circuit and the phase synchronization output control information outputted from the second flip-flop circuit.

The phase reference signal may be a clock signal or a pulse signal of a given period or may be a periodical signal of an arbitrary waveform.

In the phase synchronization system, when an input of a phase reference signal from the outside stops, oscillation of the voltage-controlled oscillation circuit can be stopped while a power supply voltage continues to be supplied. Consequently, the phase synchronization system is advantageous in that it can achieve reduction in power consumption. On the other hand, when a phase reference signal from the outside is inputted, the phase synchronization system can produce and output a system clock signal from which high frequency pulse noise signals generated by the VCO have been removed. Consequently, the phase synchronization system is advantageous also in that a circuit to which the system clock signal is supplied is prevented from suffering from a malfunction which may be caused otherwise by the high frequency pulse noise signals.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENT

Figure 1:
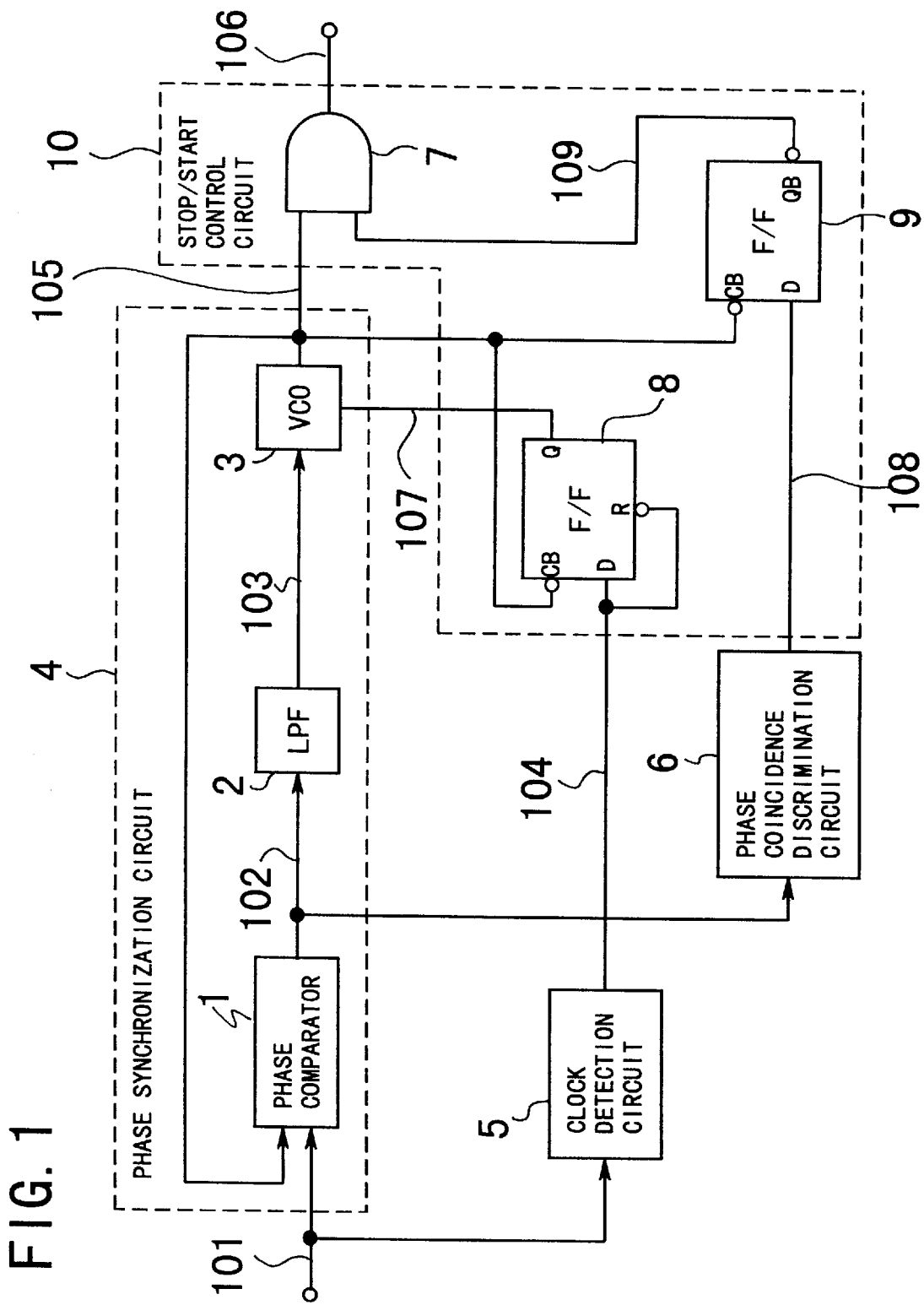
FIG. 1 is a block diagram of a phase synchronization system showing a preferred embodiment of the present invention.
Figure 2:
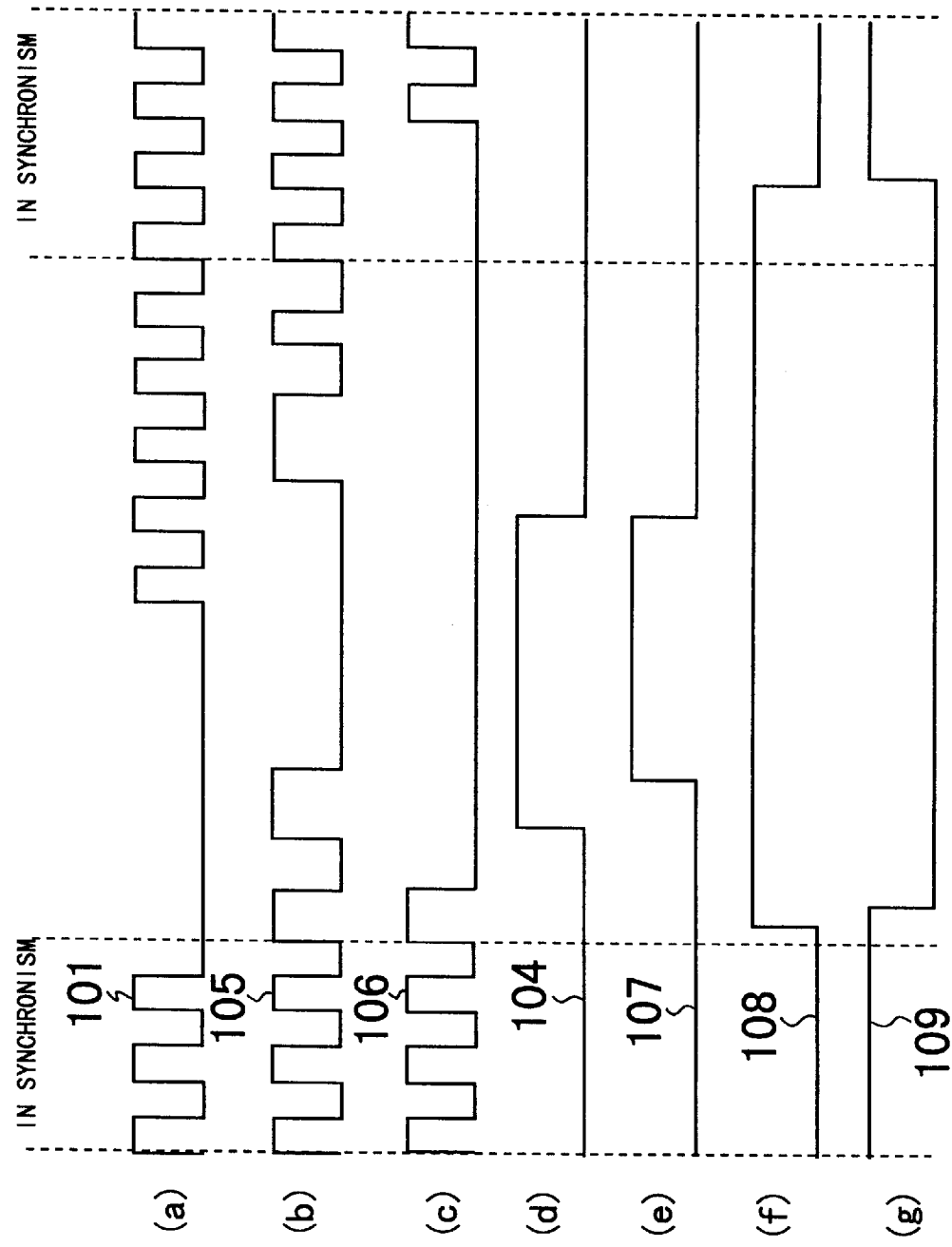
FIG. 2 is a timing chart illustrating operation of the phase synchronization system of FIG. 1.

Referring first to FIG. 1, there is shown a phase synchronization system to which the present invention is applied. The phase synchronization system shown produces and outputs a clock signal synchronized in phase with a clock signal inputted thereto as a phase reference signal from the outside similarly to the typical phase synchronization system described hereinabove with reference to FIG. 3. The present phase synchronization system includes a phase comparator 1, a phase synchronization circuit 4 including an LPF 2 and a VCO 3, a clock detection circuit 5, a phase coincidence discrimination circuit 6, an AND gate 7, and a stop/start control circuit 10 including a pair of flip-flop circuits 8 and 9. Operation of the phase synchronization system including those components is illustrated in FIG. 2.

Figure 3:
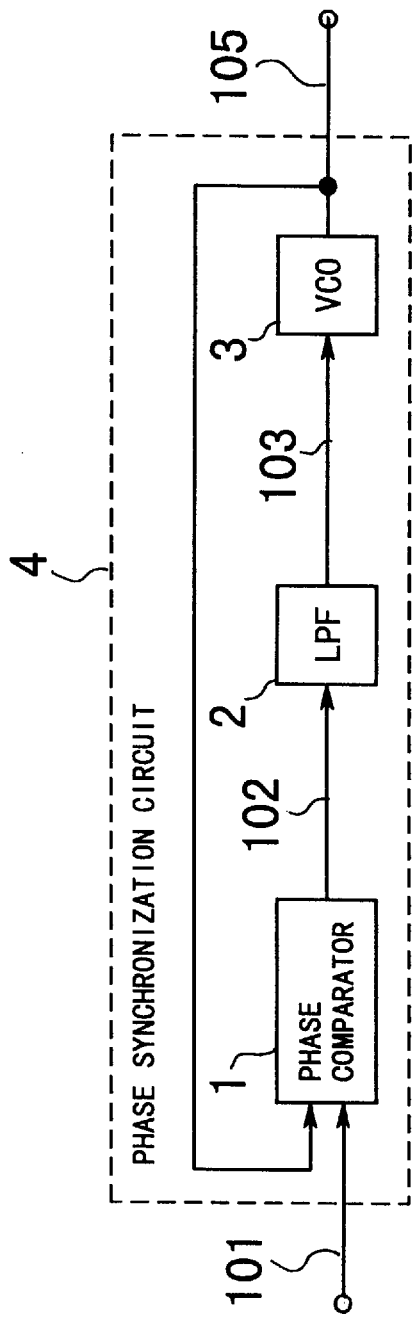
FIG. 3 is a block diagram showing a typical construction of a phase synchronization system.

Referring to FIG. 1, in a condition wherein a clock signal 101 from the outside is inputted regularly to the phase synchronization system, it is inputted to the phase comparator 1, by which it is compared in phase with a clock signal 105 outputted from the VCO 3, similarly as in the typical phase synchronization circuit described hereinabove with reference to FIG. 3. The phase comparator 1 outputs information of a phase "lead" when the clock signal 105 leads the clock signal 101 in phase, but outputs information of a phase "lag" when the clock signal 105 lags the clock signal 101 in phase, as phase comparison information 102 to the LPF 2. The LPF 2 removes high frequency components from the phase comparison information 102 and outputs resulting information as phase error information 103 to the VCO 3. The VCO 3 has an oscillation frequency controlled with the voltage level of the phase error information 103 outputted from the LPF 2, and consequently, the phase of the clock signal 105 to be outputted from the VCO 3 is controlled with the phase error information 103.

The clock signal 105 is fed back to the phase comparator 1 as described above so that it may be compared in phase with the clock signal 101 by the phase comparator 1 similarly as in the typical phase synchronization circuit described hereinabove. By negatively feeding back the phase information of the clock signal 105 to be outputted to the outside to form a phase synchronization system in this manner, the clock signal 105 is produced as a clock signal synchronized in phase with the clock signal 101 inputted from the outside in response to a phase pull-in timing of the phase synchronization circuit 4.

In the operation condition of the phase synchronization system wherein it is in synchronism with the clock signal 101 inputted from the outside as described above, the phase comparison information 102 outputted from the phase comparator 1 is inputted to the phase coincidence discrimination circuit 6, in which the phase difference between the clock signal 101 and the clock signal 105 outputted from the VCO 3 is discriminated from the phase comparison information 102. If the phase of the clock signal 105 coincides with the phase of the clock signal 101 within a predetermined allowance, phase coincidence information 108 is outputted as a signal of a low ("L") level and inputted to the flip-flop circuit 9. The flip-flop circuit 9 outputs system clock control information 109 of a high ("H") level from a negative data output terminal thereof in synchronism with a falling edge of the phase coincidence information 108 of the "L" level inputted thereto. The system clock control information 109 is inputted to one of a pair of input terminals of the AND gate 7. Meanwhile, the clock signal 105 outputted from the VCO 3 is inputted to the other input terminal of the AND gate 7. Consequently, the AND gate 7 logically ANDs the clock signal 101 and the system clock control information 109 of the "H" level and outputs a resulting signal as a system clock signal (modified phase synchronization signal) 106 to the outside.

Now, an operation function of the phase synchronization system of detecting that an input of the clock signal 101 from the outside and stopping oscillation of the VCO 3 will be described. The clock detection circuit 5 has a function of discriminating whether or not there is an input of the clock signal 101, and outputs clock detection information 104 which has the "L" level when the clock signal 101 is being inputted, but has the "H" level when the input of the clock signal 101 stops. The clock detection information 104 is inputted to the flip-flop circuit 8. The flip-flop circuit 8 produces VCO control information 107 in synchronism with a falling edge of the clock detection information 104 and inputs it to the VCO 3.

Consequently, if the input of the clock signal 101 stops, then the flip-flop circuit 8 receives an input of the clock detection information 104 of the "H" level outputted from the clock detection circuit 5 and outputs the VCO control information 107 of the "H" level in synchronism with a falling edge of the clock detection information 104 to the VCO 3, and consequently, the oscillation of the VCO 3 is stopped. At the point of time when the oscillation of the VCO 3 stops, since the VCO control information 107 outputted from the flip-flop circuit 8 remains in synchronism with the clock signal 105 outputted from the VCO 3, pulse noise signals of frequencies higher than an upper limit frequency are not outputted in a superposed condition with the clock signal 105. It is to be noted that, while the clock signal 101 continues to be inputted, the VCO control information 107 of the "L" level is outputted in synchronism with a falling edge of the clock detection information 104 of the "L" level from a positive data output terminal of the flip-flop circuit 8 and inputted to the VCO 3, and consequently, the oscillation of the VCO 3 continues.

When an input of the clock signal 101 is resumed while the input of the clock signal 101 from the outside stops and the oscillation of the VCO 3 stops, the flip-flop circuit 8 receives an input of the clock detection information 104 of the "L" level outputted from the clock detection circuit 5 and is reset at a falling edge of the clock detection information 104. Consequently, the VCO control information 107 is outputted as a signal of the "L" level from the flip-flop circuit 8 and inputted to the VCO 3. Consequently, the oscillation function of the VCO 3 is enabled again. Thereupon, there is the possibility that pulse noise signals of high frequencies higher than the upper limit oscillation frequency from the VCO 3 may be superposed with the clock signal 105 outputted from the VCO 3. However, since the system clock control information 109 outputted from the flip-flop circuit 9 changes its level to the "H" level and is inputted to the AND gate 7 after the phase coincidence information 108 outputted from the phase coincidence discrimination circuit 6 changes its level to the "L" level, that is, after coincidence of the phases is confirmed, the clock signal 105 after the phase thereof becomes stable is outputted via the AND gate 7 to the outside as the system clock signal 106 which is a modified phase synchronization signal containing no high frequency pulse noise signals.

The information signals at several components of the phase synchronization system in the present embodiment when the phase synchronization system operates in such a manner as described above are illustrated in FIG. 2. In particular, illustrated in FIG. 2 are the clock signal 101 from the outside (refer to the waveform (a)), the phase synchronization clock signal 105 outputted from the VCO 3 (refer to the waveform (b)), the system clock signal 106 outputted from the AND gate 7 (refer to the waveform (c)), the clock detection information 104 outputted from the clock detection circuit 5 (refer to the waveform (d)), the VCO control information 107 outputted from the flip-flop circuit 8 (refer to the waveform (e)), the phase coincidence information 108 outputted from the phase coincidence detection circuit 6 (refer to the waveform (f)) and the system clock control information 109 outputted from the flip-flop circuit 9 (refer to the waveform (g)) when the clock signal 101 is inputted from the outside and the phase synchronization system is in a phase synchronization condition, when the input of the clock signal 101 from the outside is stopped and the phase synchronization system is in a phase non-synchronization condition and then when the clock signal 101 is inputted from the outside again and the phase synchronization system enters a phase synchronization condition again.

Thus, in the phase synchronization system of the present embodiment, in a condition wherein an input of a clock signal from the outside stops, oscillation of the VCO can be stopped, and a phase synchronization condition can be discriminated accurately. Consequently, high frequency pulse noise signals which may otherwise be superposed with a system clock signal can be eliminated completely, and an otherwise possible malfunction of a circuit to which the system clock signal is supplied can be eliminated.

It is to be noted that, while in the foregoing description, a clock signal is inputted as a reference phase signal to be inputted from the outside, the phase reference signal to be inputted from the outside is not limited to such a clock signal as described above, and the present invention can naturally be applied effectively also to other phase synchronization systems to which a periodic signal in the form of pulses or a periodic signal of an arbitrary waveform is inputted as the phase reference signal. In this instance, the clock detection circuit 5 shown in FIG. 1 may be replaced by a detection circuit which can detect the periodic signal in the form of pulses or the periodic signal of an arbitrary waveform.

Having now fully described the invention, it will be apparent to one of ordinary skill in the art that many changes and modifications can be made thereto without departing from the spirit and scope of the invention as set forth herein.

What is claimed is:

1. A phase synchronization system, comprising a phase synchronization section including a phase comparator, a low-pass filter and a voltage-controlled oscillation circuit, said phase comparator comparing a phase of a phase reference signal inputted thereto from the outside with a phase of a phase synchronization signal fed back from said voltage-controlled oscillation circuit, said low-pass filter removing high frequency components of phase comparison information outputted from said phase comparator, an oscillation frequency of said voltage-controlled oscillation circuit being controlled with a phase difference signal outputted from said low-pass filter so that said voltage-controlled oscillation circuit oscillates and outputs the phase synchronization signal;

input signal detection section means for detecting whether or not the phase reference signal is inputted to said phase synchronization section and outputting input signal detection information of a first level;

phase coincidence discrimination section means for receiving, when an input of the phase reference signal is detected by said input signal detection section means, the phase comparison information outputted from said phase comparator of said phase synchronization section, discriminating whether or not a phase error at said phase synchronization section satisfies an allowable phase coincidence requirement and outputting phase coincidence information of a second level when it is discriminated that the phase error satisfies the allowable phase coincidence requirement; and voltage-controlled oscillation circuit stop/start control section means for receiving, when the input of the phase reference signal to said phase synchronization section stops, an input of the input signal detection information of the first level outputted from said input signal detection section means and outputting a oscillation control signal for stopping the oscillation of said voltage-controlled oscillation circuit of said phase synchronization section and for receiving, when the phase reference signal is inputted to said phase synchronization section, the phase synchronization signal outputted from said phase synchronization section and outputting the received phase synchronization signal as a modified phase synchronization signal, which does not include a pulse noise signal produced by the oscillation of said voltage-controlled oscillation circuit, in response to the input signal detection information of the first level outputted from said input signal detection section means and the phase coincidence information of the second level outputted from said phase coincidence discrimination section means.

2. A phase synchronization system as claimed in claim 1, wherein said voltage-controlled oscillation circuit stop/start control section means comprises:

first flip-flop circuit means for receiving an input of the phase synchronization signal outputted from said voltage-controlled oscillation circuit and an input of the input signal detection information of the first level outputted from said input signal detection section means, generating stop/start control information for controlling the stop/start of the oscillation of said voltage-controlled oscillation circuit and outputting the stop/start control information to said voltage-controlled oscillation circuit;

second flip-flop circuit means for receiving the phase synchronization signal outputted from said voltage-controlled oscillation circuit and the phase coincidence information of the second level outputted from said phase coincidence discrimination section means and producing and outputting phase synchronization output control information; and AND gate means for logically ANDing the stop/start control information outputted from said first flip-flop circuit means and the phase synchronization output control information outputted from said second flip-flop circuit means.

3. A phase synchronization system as claimed in claim 1, wherein the phase reference signal is a clock signal or a pulse signal of a given period.

4. A phase synchronization system as claimed in claim 1, wherein the phase reference signal is a periodical signal of an arbitrary waveform.

5. A phase synchronization system as claimed in claim 1, wherein said input signal detection section means outputs said first level when the phase reference signal is not detected.

6. A phase synchronization system as claimed in claim 1, wherein a phase difference between the phase reference signal and the phase synchronization signal is discriminated from the phase comparison information in said phase coincidence discrimination section means.

7. A phase synchronization system, comprising a phase synchronization section including a phase comparator, a low-pass filter and a voltage-controlled oscillation circuit, said phase comparator comparing a phase of a phase reference signal inputted thereto from the outside with a phase of a phase synchronization signal fed back from said voltage-controlled oscillation circuit, said low-pass filter removing high frequency components of phase comparison information outputted from said phase comparator, an oscillation frequency of said voltage-controlled oscillation circuit being controlled with a phase difference signal outputted from said low-pass filter so that said voltage-controlled oscillation circuit oscillates and outputs the phase synchronization signal;

an input signal detection section responsive to phase reference signal inputted from the outside, said input signal detection section outputting input signal detection information of a first level when the phase reference signal is stopped;

a phase coincidence discrimination section responsive to the phase comparison information from said phase comparator;

a first flip-flop circuit responsive to an input of the phase synchronization signal and an input of the input signal detection information of the first level, wherein said first flip-flop circuit generates stop/start control information that controls oscillation of said voltage-controlled oscillation circuit;

a second flip-flop circuit responsive to the phase synchronization signal and the phase coincidence information of the second level, wherein said second flip-flop circuit outputs phase synchronization output control information; and an AND gate responsive to the stop/start control information and the phase synchronization output control information, said AND gate logically ANDing the stop/start control information and the phase synchronization output control information.

8. A phase synchronization system as claimed in claim 7, wherein said first flip-flop circuit further generates stop/start control information controlling the stop/start of the oscillation of said voltage-controlled oscillation circuit and further outputting the stop/start control information to said voltage-controlled oscillation circuit.

9. A phase synchronization system as claimed in claim 7, wherein said second flip-flop further produces and outputs phase synchronization output control information.

10. A phase synchronization system as claimed in claim 7, wherein a phase difference between the phase reference signal and the phase synchronization signal is discriminated from the phase comparison information in said phase coincidence discrimination section.

11. A phase synchronization system as claimed in claim 7, wherein the phase reference signal is one of a clock signal and a pulse signal of a given period.

12. A phase synchronization system as claimed in claim 7, wherein the phase reference signal is one of a periodical signal and an arbitrary waveform.

13. A method of controlling a phase synchronization system including a phase synchronization section having a phase comparator, a low-pass filter and a voltage-controlled oscillation circuit, said phase comparator comparing a phase of a phase reference signal inputted thereto from the outside with a phase of a phase synchronization signal fed back from said voltage-controlled oscillation circuit, said low-pass filter removing high frequency components of phase comparison information outputted from said phase comparator, an oscillation frequency of said voltage-controlled oscillation circuit being controlled with a phase difference signal outputted from said low-pass filter so that said voltage-controlled oscillation circuit oscillates and outputs the phase synchronization signal, wherein the method comprises:

detecting whether or not the phase reference signal is inputted to said phase synchronization section;

outputting input signal detection information of a first level when the phase reference signal is not detected;

receiving the phase comparison information outputted from said phase comparator of said phase synchronization section when an input of the phase reference signal is detected and discriminating whether or not a phase error at said phase synchronization section satisfies an allowable phase coincidence requirement;

outputting phase coincidence information of a second level when it is discriminated that the phase error satisfies the allowable phase coincidence requirement;

receiving an input of the input signal detection information of the first level and outputting oscillation control signals for stopping the oscillation of said voltage-controlled oscillation circuit; and receiving the phase synchronization signal outputted from said phase synchronization section and outputting the received phase synchronization signal as a modified phase synchronization signal when the phase reference signal is inputted to said phase synchronization section in response to the input signal detection information of the first level and the phase coincidence information of the second level, wherein said receiving the phase synchronization signal does not include a pulse noise signal produced by the oscillation of said voltage-controlled oscillation circuit.

* * * * *